(12) United States Patent
Eom et al.

(10) Patent No.: US 8,794,502 B2
(45) Date of Patent: Aug. 5, 2014

(54) METHOD OF FORMING SOLDER ON PAD ON FINE PITCH PCB AND METHOD OF FLIP CHIP BONDING SEMICONDUCTOR USING THE SAME

(71) Applicant: Electronics and Telecommuniations Research Institute, Daejeon (KR)

(72) Inventors: Yong Sung Eom, Daejeon (KR); Kwang-Seong Choi, Daejeon (KR); Jung Hyun Noh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/760,350

(22) Filed: Feb. 6, 2013

(65) Prior Publication Data

US 2013/0334291 A1 Dec. 19, 2013

(30) Foreign Application Priority Data

Jun. 14, 2012 (KR) .......................... 10-2012-0063792

(51) Int. Cl.
*B23K 31/02* (2006.01)
*H01L 21/44* (2006.01)

(52) U.S. Cl.
USPC .......................... 228/215; 228/248.1; 438/613

(58) Field of Classification Search
None
See application file for complete search history.

(56) References Cited

U.S. PATENT DOCUMENTS

| 4,619,715 | A | * | 10/1986 | Hwang | 148/23 |
| RE32,309 | E | * | 12/1986 | Hwang | 148/23 |
| 5,074,928 | A | * | 12/1991 | Sanji et al. | 148/23 |
| 5,545,465 | A | * | 8/1996 | Gaynes et al. | 428/209 |
| 5,704,730 | A | * | 1/1998 | Burton-Chambers | 404/6 |
| 5,868,302 | A | * | 2/1999 | Onishi et al. | 228/180.21 |
| 6,173,887 | B1 | * | 1/2001 | Mead et al. | 228/248.1 |
| 6,264,097 | B1 | * | 7/2001 | Sano | 228/245 |
| 6,709,966 | B1 | * | 3/2004 | Hisatsune et al. | 438/613 |
| 7,059,512 | B2 | * | 6/2006 | Arita et al. | 228/254 |
| 7,531,387 | B1 | * | 5/2009 | Karashima et al. | 438/127 |
| 7,743,493 | B2 | * | 6/2010 | Uchikoba | 29/846 |
| 7,905,011 | B2 | * | 3/2011 | Taniguchi et al. | 29/843 |

(Continued)

FOREIGN PATENT DOCUMENTS

| JP | 2004-174538 A | * | 4/1991 |
| JP | 06-125169 A | * | 5/1994 |
| JP | 2000-062136 A | * | 2/2000 |
| JP | 2001-293594 A | * | 10/2001 |

OTHER PUBLICATIONS

Jin Yang et al., "Study of Stencil Printing Technology for Fine Pitch Flip Chip Bumping", 2009 International Conference on Electronic Packaging Technology & High Density Packaging (ICEPT-HDP), Aug. 10-13, 2009, pp. 900-905.

*Primary Examiner* — Kiley Stoner
(74) *Attorney, Agent, or Firm* — Rabin & Berdo, P.C.

(57) ABSTRACT

Disclosed are a method of forming a solder on pad on a fine pitch PCB and a method of flip chip bonding a semiconductor device using the same. The method of forming a solder on pad on a fine pitch PCB includes: applying a solder bump maker (SBM) paste with a predetermined thickness to an entire surface of a PCB including a metal pad and a solder mask; heating the SBM paste at a temperature higher than a melting point of solder contained in the SBM paste and then cooling the SBM paste to form a solder on pad; and washing a residual polymer resin and residual solder particles of the SBM paste by using a solvent.

21 Claims, 6 Drawing Sheets

(56) References Cited

U.S. PATENT DOCUMENTS

| | | | |
|---|---|---|---|
| 2001/0038882 A1* | 11/2001 | Onishi et al. | 427/96 |
| 2002/0023342 A1* | 2/2002 | Nakamura | 29/832 |
| 2004/0069840 A1* | 4/2004 | Mackay | 228/248.1 |
| 2004/0165362 A1* | 8/2004 | Farnworth | 361/764 |
| 2004/0219774 A1* | 11/2004 | Shen | 438/612 |
| 2005/0001014 A1* | 1/2005 | Takeuchi et al. | 228/110.1 |
| 2005/0058771 A1* | 3/2005 | Herron et al. | 427/96.1 |
| 2005/0092810 A1* | 5/2005 | Koopmans | 228/39 |
| 2005/0133572 A1* | 6/2005 | Brese et al. | 228/180.22 |
| 2005/0218195 A1* | 10/2005 | Wilson et al. | 228/180.22 |
| 2007/0257362 A1 | 11/2007 | Karashima et al. | |
| 2008/0003804 A1* | 1/2008 | Nalla et al. | 438/613 |
| 2008/0265437 A1* | 10/2008 | Shiraishi et al. | 257/778 |
| 2009/0057378 A1* | 3/2009 | Hwang et al. | 228/248.1 |
| 2009/0200639 A1* | 8/2009 | Kariya | 257/532 |
| 2009/0226630 A1 | 9/2009 | Bae | |
| 2009/0239091 A1* | 9/2009 | Abe | 428/546 |
| 2010/0029074 A1 | 2/2010 | MacKay et al. | |
| 2010/0072263 A1* | 3/2010 | Gruber et al. | 228/176 |
| 2010/0089983 A1 | 4/2010 | MacKay et al. | |
| 2010/0132998 A1* | 6/2010 | Lee et al. | 174/267 |
| 2011/0079926 A1* | 4/2011 | Chung et al. | 257/778 |
| 2011/0089577 A1* | 4/2011 | Eom et al. | 257/778 |
| 2011/0133137 A1* | 6/2011 | Hirano et al. | 252/519.33 |
| 2011/0133338 A1* | 6/2011 | Topacio et al. | 257/751 |
| 2011/0201195 A1* | 8/2011 | Kitae et al. | 438/613 |
| 2012/0309866 A1* | 12/2012 | Jang et al. | 523/160 |
| 2012/0318855 A1* | 12/2012 | McLeod et al. | 228/203 |
| 2013/0316492 A1* | 11/2013 | Ushifusa et al. | 438/98 |

* cited by examiner

FIG. 1

HEAT

METHOD OF FORMING SOLDER ON PAD ON FINE PITCH PCB AND METHOD OF FLIP CHIP BONDING SEMICONDUCTOR USING THE SAME

CROSS-REFERENCE TO RELATED APPLICATIONS

This application is based on and claims priority from Korean Patent Application No. 10-2012-0063792, filed on Jun. 14, 2012, with the Korean Intellectual Property Office, the disclosure of which is incorporated herein in its entirety by reference.

TECHNICAL FIELD

The present disclosure relates to a method of forming a solder on pad, and more particularly to, a method of forming a solder on pad (solder bump) on a fine pitch PCB, which forms a low volume solder on pad when a metal pad in a thickness direction is positioned at a portion lower than a surface of a PCB to have a concave shape due to a solder mask formed on a fine pitch metal pad of the PCB, and a method of flip chip bonding a semiconductor device using the same.

BACKGROUND

Recently, as an electronic device becomes small and slim, such as a portable terminal including a mobile phone and a notebook computer becoming slim to have a thickness in a level of several mm, a technology for refining a copper circuit pattern of a PCB has been demanded.

In the related art, in order to form a solder on pad on a metal pad of a PCB, a metal mask for a screen printer having a shape matched one-to-one with each metal pad is manufactured, and then a solder paste is applied only to a metal pad portion.

In such a case, when a pitch of the metal pad is 130 μm or less, a spreading property of the solder paste from a mask is deteriorated, so that it is difficult to evenly apply a predetermined quantity of solder paste on the metal pad.

SUMMARY

The present disclosure has been made in an effort to provide a method of forming a solder on pad on a fine pitch PCB, which forms a low volume solder on pad (LVSoP) on a PCB having a fine pitch of 130 μm or less.

The present disclosure provides a method of forming a solder on pad on a fine pitch PCB, which may easily perform flip chip bonding of a semiconductor device on which a copper pillar is formed, and a method of flip chip bonding a semiconductor device using the same.

An exemplary embodiment of the present disclosure provides a method of forming a solder on pad on a fine pitch PCB, the method including: applying a solder bump maker (SBM) paste with a predetermined thickness to an entire surface of a PCB including a metal pad and a solder mask; heating the SBM paste at a temperature higher than a melting point of solder contained in the SBM paste and then cooling the SBM paste to form a solder on pad; and washing a residual polymer resin and residual solder particles of the SBM paste by using a solvent.

Another exemplary embodiment of the present disclosure provides a method of flip chip bonding a semiconductor device, including: applying a solder bump maker (SBM) paste with a predetermined thickness to an entire surface of a PCB including a metal pad and a solder mask; heating the SBM paste at a temperature higher than a melting point of solder contained in the SBM paste and then cooling the SBM paste to form a solder on pad; washing a residual polymer resin and residual solder particles of the SBM paste by using a solvent; applying a flux for removing an oxide film to the entire surface of the PCB on which the solder on pad is formed; flip chip bonding a semiconductor device on which a copper pillar is formed to the PCB to which the flux is applied; and removing a residual flux.

Yet another exemplary embodiment of the present disclosure provides a method of flip chip bonding a semiconductor device, including: applying a solder bump maker (SBM) paste with a predetermined thickness to an entire surface of a PCB including a metal pad and a solder mask; heating the SBM paste at a temperature higher than a melting point of solder contained in the SBM paste and then cooling the SBM paste to form a solder on pad; washing a residual polymer resin and residual solder particles of the SBM paste by using a solvent; applying a fluxing underfill configured to perform a function of removing an oxide film and an underfill function to the entire surface of the PCB on which the solder on pad is formed; and flip chip bonding a semiconductor device on which a copper pillar is formed to the PCB to which the fluxing underfill is applied.

As described above, according to the exemplary embodiments of the present disclosure, by providing a method of forming a solder on pad on a fine pitch PCB, which includes applying an SBM paste with a predetermined thickness to an entire surface of a PCB including a metal pad and a solder mask, and then heating and cooling the SBM paste to form a low volume solder on pad, and a method of flip clip bonding a semiconductor device using the same, so that it is possible to very easily form a low volume solder on pad, and it is possible to prevent an electrical connection of adjacent solders on pad caused by processing pressure during the flip chip bonding of a semiconductor device on which a copper pillar is formed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 1:
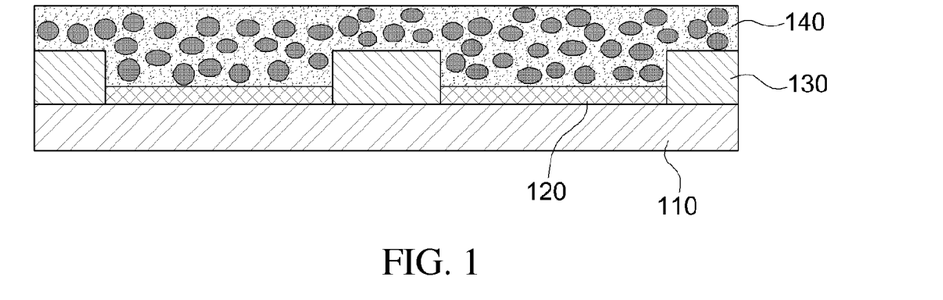
FIGS. 1 to 3 are process flow diagrams for describing a method of forming a solder on pad on a fine pitch PCB according to an exemplary embodiment of the present disclosure.
Figure 2:
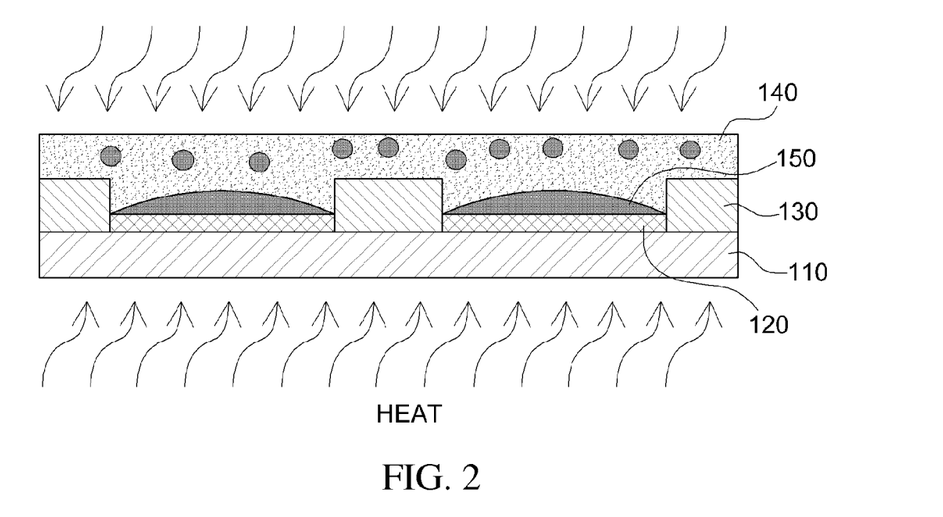
Figure 3:
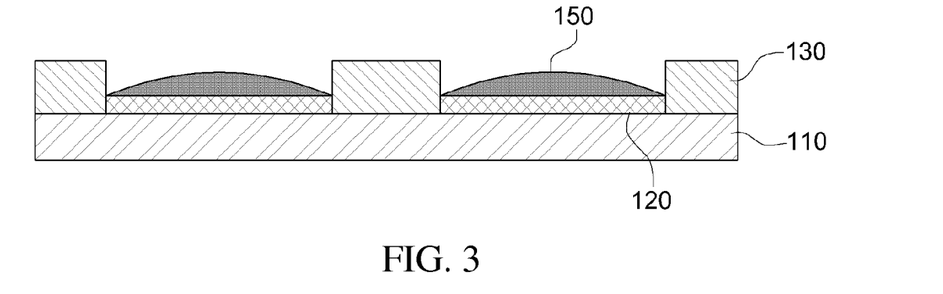

FIGS. 1 to 3 are process flow diagrams for describing a method of forming a solder on pad on a fine pitch PCB according to an exemplary embodiment of the present disclosure.

Referring to FIG. 1, a metal pad 120 formed on a surface of a PCB 110 is covered by a solder mask 130 using a polymer material with a predetermined thickness to have a concave shape. A solder bump maker (SBM) paste 140 is applied with a predetermined thickness to an entire surface of the PCB 110 including the metal pad 120 and the solder mask 130.

The SBM paste 140 contains a polymer resin of 15 to 25% by weight, a reducing agent of 1 to 10% by weight, and solder of 50 to 80% by weight based on 100% by weight of the SBM paste.

The polymer resin is one element material exhibiting no reaction according to increase and decrease in a temperature, and may include DGEBA, TGDDM, TriTGDDM, isocyanate, bismaleimide, epoxy-modified silicon oil, amine-modified silicon oil, carboxyl-modified silicon oil and polyol.

The reducing agent may include glutaric acid, malic acid, azelaic acid, abietic acid, adipic acid, ascorbic acid, acrylic acid and citric acid.

A size of a particle of the solder is 0.1 to 70 μm, and the solder may use an alloy of Sn, Bi, Ag, Cu, In and Pb, and preferably a composition of 60Sn/40Bi, 52In/48Sn, 97In/3Ag, 57Bi/42Sn/1Ag, 58Bi/42Sn, 52Bi/32Pb/16Sn and 96.5Sn/3Ag/0.5Cu, and does not use a solvent.

In the present disclosure, the SBM paste 140 is applied with a predetermined thickness on the entire surface of the PCB 110 including the solder mask 130, as well as the metal pad 120, so that the solder on pad may be easily formed on the PCB having a pitch of 130 μm or less.

Referring to FIG. 2, the SBM paste 140 is heated at a temperature higher than a melting point of the solder contained in the SBM paste 140 and then cooled. Accordingly, solder particles exhibit a wetting characteristic on the metal pad 120, so that a low volume solder on pad (hereinafter, referred to as LVSoP) 150 is formed. In this case, the polymer resin contained in the SBM paste 140 represents a liquid property in a room temperature state even after the process, and the solder particles which are not involved in the wetting characteristic of the metal pad 120 are confined within the polymer resin of the SBM paste 140.

Referring to FIG. 3, the residual polymer resin and the residual solder particles of the SBM paste 140 are washed by using a solvent.

Finally, a height of the LVSoP 150 is similar to that of the solder mask 130.

Figure 4:
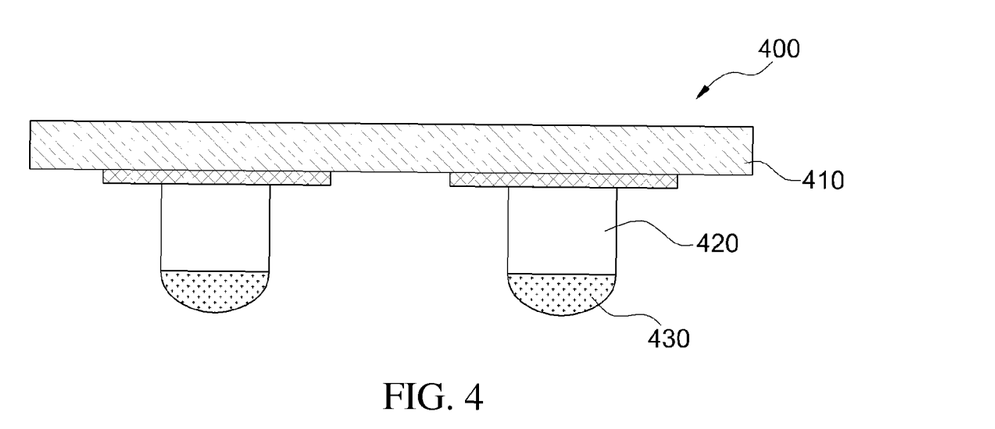
FIGS. 4 to 6 are process flow diagrams for describing a method of flip chip bonding a semiconductor device to a PCB on which an LVSoP is formed according to another exemplary embodiment of the present disclosure.
Figure 5:
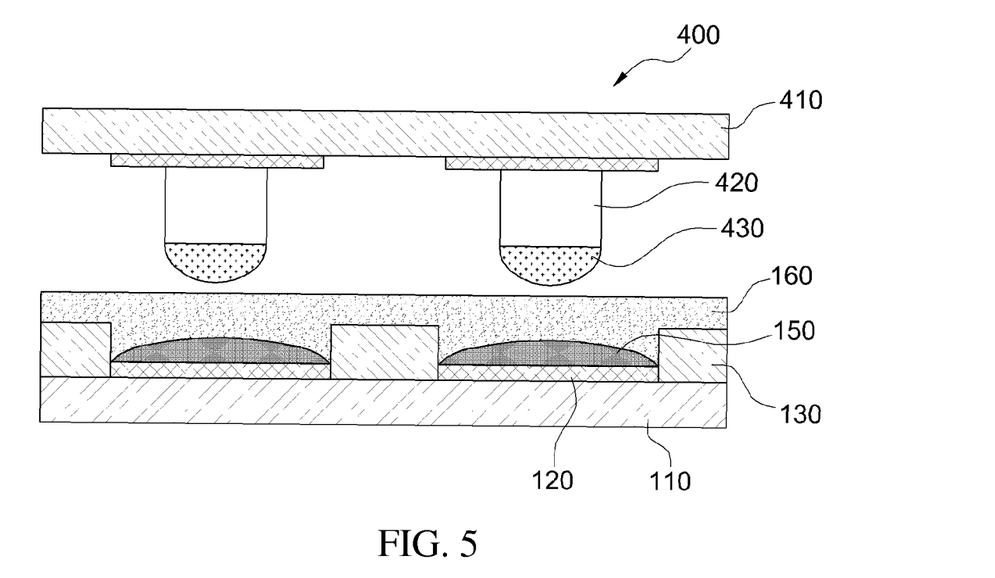
Figure 6:
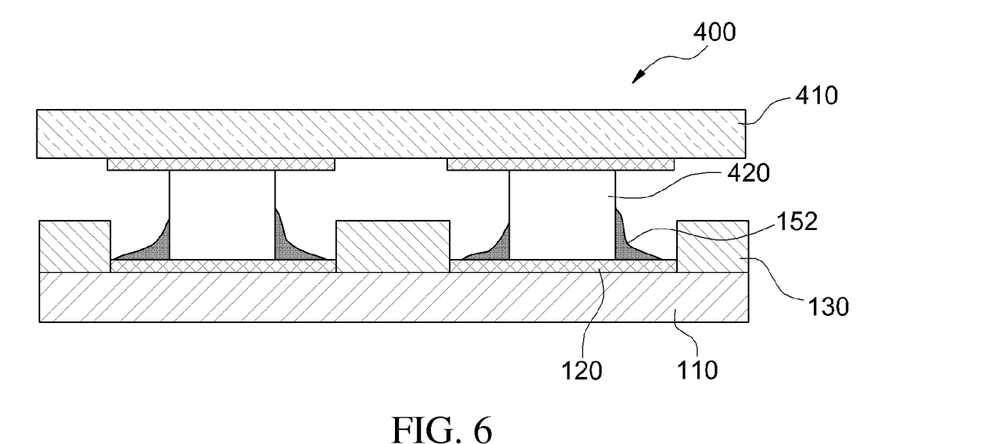

FIGS. 4 to 6 are process flow diagrams for describing a method of flip chip bonding a semiconductor device to a PCB on which an LVSoP is formed according to another exemplary embodiment of the present disclosure.

Referring to FIG. 4, a semiconductor device 400 flip chip bonded to the PCB 110 on which the LVSoP 150 is formed is illustrated. Cu pillars 420 having a protruding shape are formed on a substrate 410 of the semiconductor device 400, and a solder cap or a nickel cap 430 may be formed at an end of the Cu pillar 420. Here, the solder cap or the nickel cap 430 may be omitted according to necessity.

Referring to FIG. 5, a flux 160 for removing an oxide film is applied to the surface of the PCB 110 on which the LVSoP 150 is formed.

Referring to FIG. 6, the semiconductor device 400 is flip chip bonded to the PCB 110 to which the flux 160 is applied by applying heat and slight pressure, and then the residual flux is removed. In this case, even though high pressure is applied to the LVSoP 150, a uniform distance is maintained between the semiconductor device 400 and the PCB 110, so that an electrical connection of adjacent metal pads caused by the separation of the solder 152 from the metal pad 120 may be prevented. Accordingly, when the LVSoP 150 according to the present disclosure is used, the electrical connection between adjacent metal pads may be completely prevented regardless of the use of pressure during the flip chip bonding of the semiconductor device.

Figure 7:
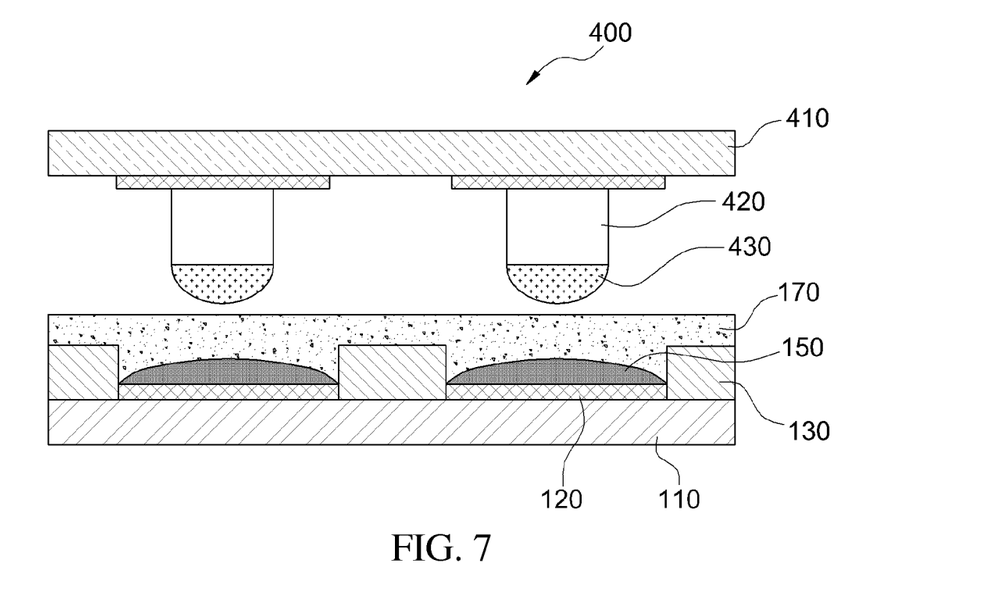
FIGS. 7 and 8 are process flow diagrams for describing a method of flip chip bonding a semiconductor device to a PCB on which an LVSoP is formed according to yet another exemplary embodiment of the present disclosure.
Figure 8:
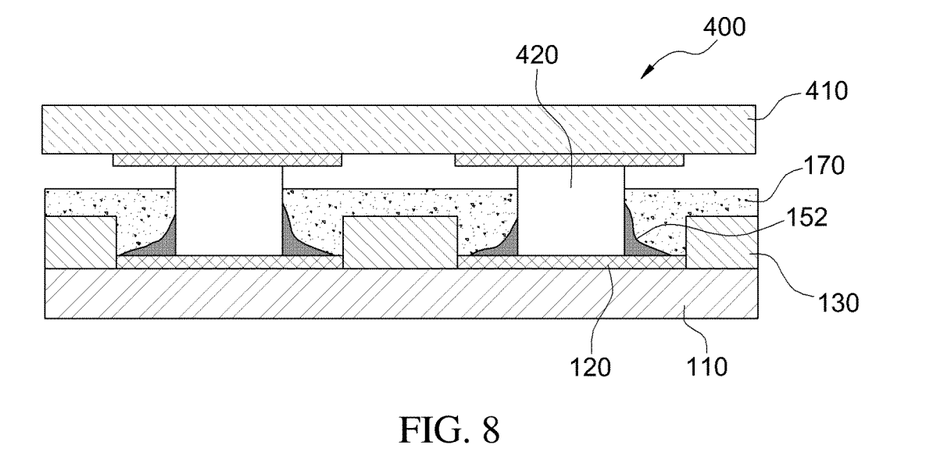

FIGS. 7 and 8 are process flow diagrams for describing a method of flip chip bonding a semiconductor device to a PCB on which an LVSoP is formed according to yet another exemplary embodiment of the present disclosure.

Referring to FIG. 7, a fluxing underfill 170 for simultaneously performing a function of removing the oxide film and an underfill function is applied to the surface of the PCB 110 on which the LVSoP 150 is formed. Here, the fluxing underfill 170 may be a thermosetting mixture or a photo-curable material including no low melting point solder.

Referring to FIG. 8, the semiconductor device 400 is flip chip bonded to the PCB 110 to which the fluxing underfill 170 is applied by applying heat and slight pressure. Here, the fluxing underfill 170 removes the oxide film of the LVSoP 150, and is cured after the LVSoP 150 exhibits the wetting characteristic to be changed from a liquid state to a solid state.

Accordingly, as illustrated in FIG. 8, when the flip chip bonding is performed on the PCB 110 on which the LVSoP 150 is formed by using the fluxing underfill 170, the fluxing underfill 170 has a shape surrounding the Cu pillar 420 and the solder 152, so that very excellent reliability may be expected.

Figure 9:
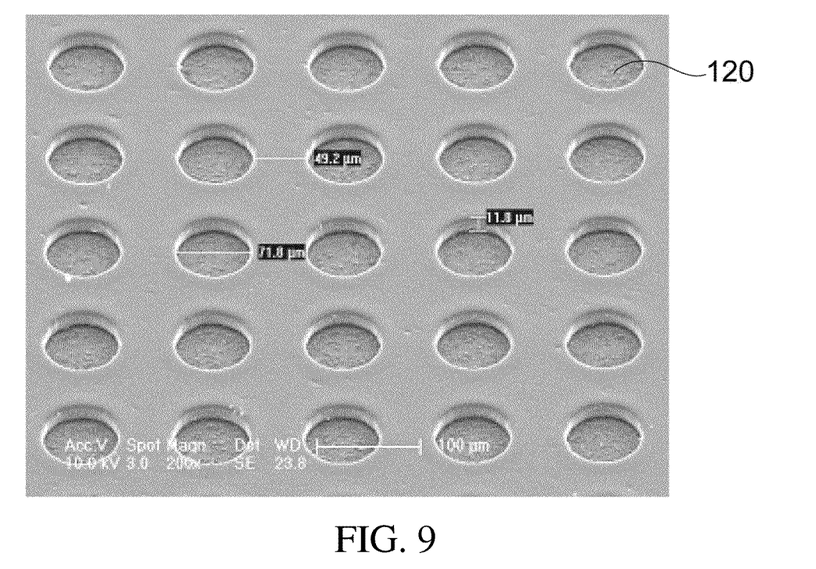
FIG. 9 is a SEM picture of a PCB on which a metal pad having a diameter of 70 μm and a pitch of 130 μm and a solder mask having a thickness of approximately 10 μm are formed.

FIG. 9 is a SEM picture of a PCB on which a metal pad having a diameter of 70 μm and a pitch of 130 μm and a solder mask having a thickness of approximately 10 μm are formed.

As illustrated in FIG. 9, the metal pad 120 of the PCB has a concave circular shape.

The SBM paste is applied to the entire surface of the PCB in a thickness of approximately 30 μm according to the process of FIG. 1, and the SBM paste is heated to a temperature of 200° C. and is maintained for approximately 10 seconds, and then is cooled down to a normal temperature according to the process of FIG. 2. Then, the residual polymer resin and the residual solder particles of the SBM paste are washed by using an ultrasonic washing device using acetone and water according to the process of FIG. 3.

Figure 10:
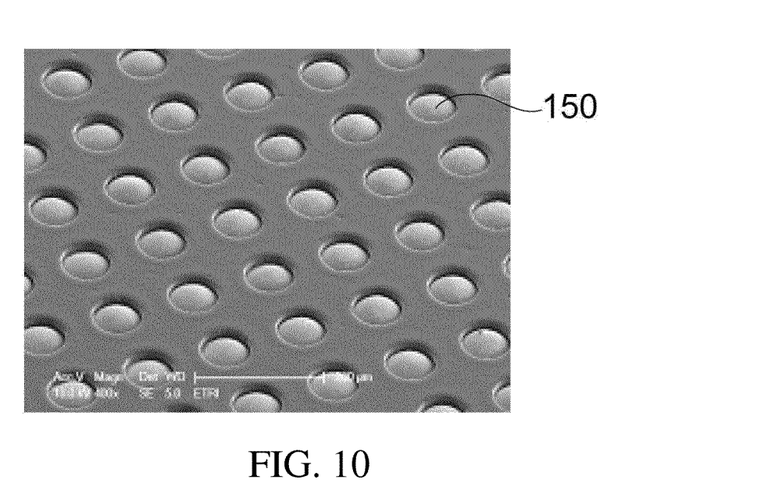
FIG. 10 is a SEM picture of the PCB of FIG. 9 on which an LVSoP is formed through the process of FIGS. 1 to 3.

As a result, as illustrated in FIG. 10, the LVSoP 150 is formed on the metal pad of the PCB.

Figure 11:
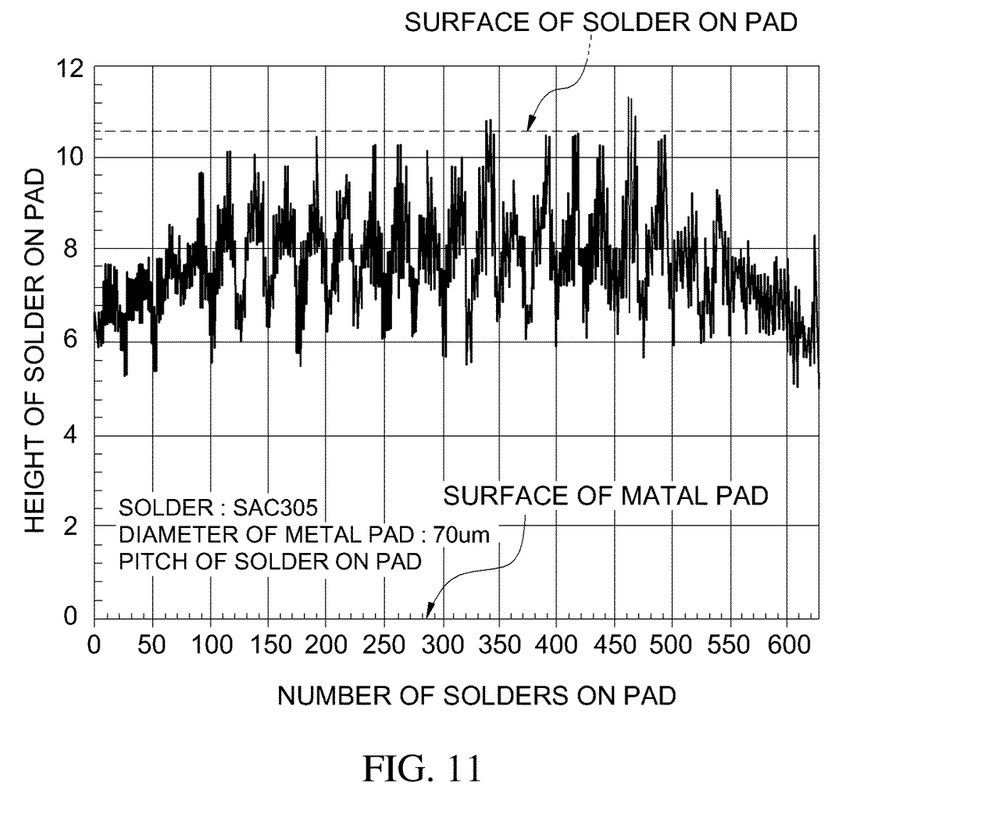
FIG. 11 is a graph of measured heights of the LVSoPs of FIG. 9.

FIG. 11 is a graph illustrating heights of the LVSoPs measured using the metal pad of the PCB as a reference surface, and approximately 3 and 4 LVSoPs are higher than the solder mask, and the heights of the most LVSoPs are measured as 5 to 10 μm.

Figure 12:
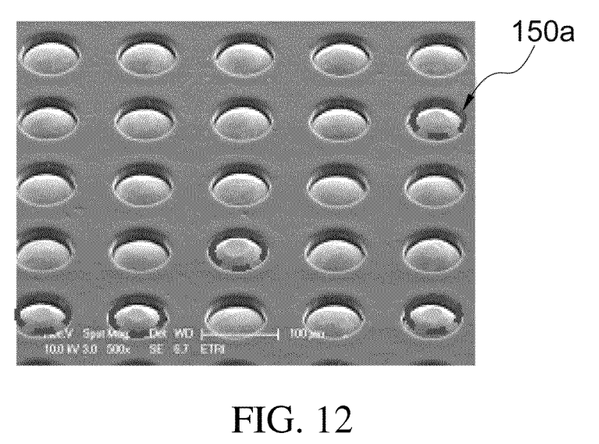
FIG. 12 is a SEM picture of a PCB on which an LVSoP higher than a solder mask is flattened through a coining process.

Accordingly, an LVSoP 150a higher than that of the solder mask may be flattened as illustrated in FIG. 12 by performing a coining process on the PCB on which the LVSoP of FIG. 10 is formed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of forming a solder on pad on a fine pitch PCB, the method comprising:
    forming a metal pad and a solder mask on a PCB, wherein:
        the metal pad has a lower surface facing the PCB and an opposite upper surface,
        the solder mask has a lower surface facing the PCB and an opposite upper surface, and
        the upper surface of the solder mask is disposed at a level higher than a level at which the upper surface of the metal pad is disposed;
    applying a solder bump maker (SBM) paste with a predetermined thickness over an entire surface of the PCB including the metal pad and the solder mask, wherein the SBM paste applied over the PCB forms a first region covering the upper surface of the metal pad and a second region covering the entire upper surface of the solder mask, and the SBM paste of the first region has a bottom surface facing the metal pad and a top surface opposite to the bottom surface, the top surface being disposed at a level higher than a level at which the upper surface of the solder mask is disposed;
    while the SBM paste is above the solder mask, at a temperature higher than a melting point of solder contained in the SBM paste and then cooling the SBM paste to form a solder on pad; and
    washing a residual polymer resin and residual solder particles of the SBM paste by using a solvent.

2. The method of claim 1, wherein in the forming of the solder on pad, the solder particles of the SBM paste exhibit a wetting characteristic on the metal pad, so that the solder on pad is formed.

3. The method of claim 1, wherein the SBM paste contains a polymer resin of 15 to 25% by weight, a reducing agent of 1 to 10% by weight, and solder of 50 to 80% by weight based on 100% by weight of the SBM paste.

4. The method of claim 3, wherein the polymer resin includes at least one of DGEBA, TGDDM, TriTGDDM, isocyanate, bismaleimide, epoxy-modified silicon oil, amine-modified silicon oil, carboxyl-modified silicon oil and polyol.

5. The method of claim 3, wherein the reducing agent includes at least one of glutaric acid, malic acid, azelaic, acid, abietic acid, adipic acid, ascorbic acid, acrylic acid and citric acid.

6. The method of claim 3, wherein a size of the particle of the solder is 0.1 μm to 70 μm.

7. The method of claim 3, wherein the solder includes at least one of Sn, Bi, Ag, Cu, In and Pb.

8. The method of claim 1, further comprising:
    performing a coining process on the PCB on which the solder on pad is formed.

9. The method of flip chip bonding a semiconductor device, comprising:
    forming a metal pad and a solder mask on a PCB, wherein:
        the metal pad has a lower surface facing the PCB and an opposite upper surface,
        the solder mask has a lower surface facing the PCB and an opposite upper surface, and
        the upper surface of the solder mask is disposed at a level higher than a level at which the upper surface of the metal pad is disposed;
    applying a solder bump maker (SBM) paste with a predetermined thickness over an entire surface of the PCB including the metal pad and the solder mask, wherein the SBM paste applied over the PCB forms a first region covering the upper surface of the metal pad and a second region covering the upper surface of the solder mask, and the SBM paste of the first region has a bottom surface facing the metal pad and a top surface opposite to the bottom surface, the top surface being disposed at a level higher than a level at which the upper surface of the solder mask is disposed;
    while the SBM paste is above the solder mask, at a temperature higher than a melting point of solder contained in the SBM paste and then cooling the SBM paste to form a solder on pad;
    washing a residual polymer resin and residual solder particles of the SBM paste by using a solvent;
    applying a flux for removing an oxide film to the entire surface of the PCB on which the solder on pad is formed;
    flip chip bonding a semiconductor device to the PCB to which the flux is applied; and
    removing a residual flux, wherein the semiconductor device includes a copper pillar that is bonded to the solder on pad.

10. The method of claim 9, wherein a solder cap or a nickel cap is formed at an end of the copper pillar.

11. The method of flip chip bonding a semiconductor device, comprising:
    forming a metal pad and a solder mask on a PCB, wherein:
        the metal pad has a lower surface facing the PCB and an opposite upper surface,
        the solder mask has a lower surface facing the PCB and an opposite upper surface, and
        the upper surface of the solder mask is disposed at a level higher than a level at which the upper surface of the metal pad is disposed;
    applying a solder bump maker (SBM) paste with a predetermined thickness over an entire surface of the PCB including the metal pad and the solder mask, wherein the SBM paste applied over the PCB forms a first region covering the upper surface of the metal pad and a second region covering the entire upper surface of the solder mask, and the SBM paste of the first region has a bottom surface facing the metal pad and a top surface opposite to the bottom surface, the top surface being disposed at a level higher than a level at which the upper surface of the solder mask is disposed;
    while the SBM paste is above the solder mask, at a temperature higher than a melting point of solder contained in the SBM paste and then cooling the SBM paste to form a solder on pad;
    washing a residual polymer resin and residual solder particles of the SBM paste by using a solvent;
    applying a fluxing underfill configured to perform a function of removing an oxide film and an underfill function to the entire surface of the PCB on which the solder on pad is formed; and
    flip chip bonding a semiconductor device to the PCB to which the fluxing underfill is applied, wherein the semiconductor device includes a copper pillar that is bonded to both of the fluxing underfill and the solder on pad.

12. The method of claim 11, wherein a solder cap or a nickel cap is formed at an end of the copper pillar.

13. The method of claim 1, wherein the solder on pad has a bottom surface in contact with the metal pad and a top surface opposite to the bottom surface, and the top surface is disposed at a level not higher than a level at which the upper surface of the solder mask is disposed.

14. The method of claim 9, wherein the solder on pad has a bottom surface in contact with the metal pad and a top surface opposite to the bottom surface, and, before the flip chip bonding step, the top surface is disposed at a level not higher than a level at which the upper surface of the solder mask is disposed.

15. The method of claim 11, wherein the solder on pad has a bottom surface in contact with the metal pad and a top surface opposite to the bottom surface, and, before the flip chip bonding step, the top surface is disposed at a level not higher than a level at which the upper surface of the solder mask is disposed.

16. The method of claim 1, wherein the SBM paste is applied over the PCB such that the SBM paste does not come in contact with the surface of the PCB.

17. The method of claim 9, wherein the SBM paste is applied over the PCB such that the SBM paste does not come in contact with the surface of the PCB.

18. The method of claim 11, wherein the SBM paste is applied over the PCB such that the SBM paste does not come in contact with the surface of the PCB.

19. The method of claim 1, wherein the step of heating the SBM paste starts while the SBM paste covers the upper surface of the metal pad and the entire upper surface of the solder mask.

20. The method of claim 9, wherein the step of heating the SBM paste starts while the SBM paste covers the upper surface of the metal pad and the entire upper surface of the solder mask.

21. The method of claim 11, wherein the step of heating the SBM paste starts while the SBM paste covers the upper surface of the metal pad and the entire upper surface of the solder mask.

* * * * *